United States Patent [19]

Kato et al.

[11] Patent Number: 4,735,877
[45] Date of Patent: Apr. 5, 1988

[54] LITHOGRAPHIC MASK STRUCTURE AND LITHOGRAPHIC PROCESS

[75] Inventors: Hideo Kato, Yokohama; Yoshie Izawa, Atsugi; Keiko Chiba, Isehara, all of Japan

[73] Assignee: Canon Kabushiki Kaisha, Tokyo, Japan

[21] Appl. No.: 915,376

[22] Filed: Oct. 6, 1986

[30] Foreign Application Priority Data

Oct. 7, 1985 [JP] Japan .................................. 60-221972
Aug. 23, 1986 [JP] Japan .................................. 61-196499

[51] Int. Cl.⁴ .............................................. G03F 7/10
[52] U.S. Cl. ........................................ 430/5; 430/139; 430/396; 428/65; 250/461.1
[58] Field of Search ................... 430/5, 139, 252, 311, 430/328, 396, 494, 967; 428/65, 446, 469, 698; 250/461.1, 462.1

[56] References Cited

U.S. PATENT DOCUMENTS 3,650,976  3/1972  Luckey .................................. 430/6
3,778,615 12/1973  Luckey .................................. 430/6
4,677,042  6/1987  Kato et al. .

Primary Examiner—John E. Kittle
Assistant Examiner—Terry J. Owens
Attorney, Agent, or Firm—Fitzpatrick, Cella, Harper & Scinto

[57] ABSTRACT

There is disclosed a lithographic mask structure which comprises a masking material support film and an annular support substrate for supporting the masking material support film at the periphery, the masking material support film containing a fluorescent substance. Also disclosed is a lithographic process for exposing a photosensitive material to irradiation with a radiation beam through a masking material support film provided with a masking material pattern-wise.

56 Claims, 3 Drawing Sheets

LITHOGRAPHIC MASK STRUCTURE AND LITHOGRAPHIC PROCESS

BACKGROUND OF THE INVENTION

1. Field of the Invention

This invention relates to a lithographic process for exposing a photosensitive material to irradiation with a radiation beam through a masking material support film provided with a masking material pattern-wise, and also to a lithographic mask structure.

2. Related Background Art

X-ray lithography has many distinguished advantages over the conventional lithography using visible light or ultraviolet light owing to the properties proper to the X-rays such as rectilinear propagation, non-interference, low diffraction, etc., and thus has been regarded as an important and useful means for submicron lithography or quater-micron lithography. However, in spite of the many advantages over the conventional lithography using visible light or ultraviolet light, the X-ray lithography still has such a disadvantage as a low productivity that is, a high cost, owing to the power shortage of X-ray source, the low sensitivity of resist, the difficult alignment, the difficult choice of masking material, the difficult processing procedure, etc. and thus its practical application has been considerably delayed.

A most successful practical resist among those so far disclosed in the literature, etc. on the lithography is polymethyl methacrylate (PMMA), which is also a successful resist for electron beams, which can particularly meet the requirement for less than 0.1 μm, and thus no other competitive materials have been found yet. A still remaining important problem of X-ray lithography is a problem of sensitivity. It is said that the X-ray utilization efficiency of resist in the X-ray lithography is usually 0.3% at most, which is a cause for lowering the sensitivity. For example, in the case of PMMA using a Pd $K_\alpha$ beam as X-ray, it is said that the sensitivity is 1,000 to 2,000 mJ/cm$^2$, where the sensitivity is given by an X-ray irradiation dosage at the exposure. That is, the lower the irradiation dosage, the higher the sensitivity. A practical resist of high sensitivity is chloromethylated polystyrene (CMS), which has a sensitivity of about 100 mJ/cm$^2$ under the same conditions as above. A condition for practical application of X-ray lithography is a necessary provision of X-ray resist having a sensitivity of not more than 10 mJ/cm$^2$, and its development has been desired.

Now, researches have been made for higher productivity in three directions, i.e. intensity of beam source, X-ray transmission of masking material support body and X-ray intransmission of masking material, and sensitivity of resist, but no rapid and remarkable development is expectable owing to many restricting factors. However, a higher sensitivity of resist can be an essential condition from a fact that a device would be damaged if the X-ray is too strong. It is needless to say that this condition is necessary and essential even if the properties of mask and beam source are improved in the future.

Description will be made of X-ray lithographic mask below. In the lithography using visible light and ultraviolet light, a glass plate and a quartz plate are used as a masking material support body (light-transmissible body). However, the wavelength utilizable in the X-ray lithography is, for example, 1 to 200 Å. The so far available glass plate or quartz plate has a large absorption in the X-ray wavelength region, and must be as thick as 1-2 mm to maintain flatness, with a failure to transmit the X-ray therethrough. Thus, the glass plate or quartz plate is not suitable as a material for X-ray lithographic masking material support body.

Generally, the X-ray transmissivity depends on the density of a material, and thus inorganic or organic materials of low density have been studied as materials for an X-ray lithographic masking material support body, and include, for example, such inorganic materials as simple substances, e.g. beryllium (Be), titanium (Ti), silicon (Si), and boron (B), their compounds, etc. and organic materials such as polyimide, polyamide, polyester, poly-p-xylylene (trade name parylene) produced by Union Carbide, Co.,), etc.

In an actual application of these materials as a material for X-ray lithographic masking material support body, it is necessary to make them into a thin film to make the X-ray transmission as high as possible. It is required that the film thickness is not more than a few μm for the inorganic materials and not more than a few tens μm for the organic materials. In the formation of a masking material support body (which will be hereinafter referred to as "a masking material support film") composed of, for example, an inorganic thin film or its composite film to this end, there has been proposed a process which comprises forming a film of silicon nitride, silicon oxide, boron nitride or silicon carbide on a silicon plate of good flatness by vapor deposition, etc., and then removing the silicon plate by etching.

On the other hand, the X-ray lithographic masking material (X-ray absorbing material, which will be hereinafter referred to as "a masking material") support on the above-mentioned masking material support film includes films of materials generally having a high density, for example, gold, platinum, tungsten, tantalum, copper, or nickel, preferably films having a thickness of 0.5 to 1 μm. Such a masking material can be formed, for example, by forming a thin film of high density masking material throughout on a masking material support film, then applying a resist thereto, depicting a desired pattern on the resist by an electron beam, light, etc., and then forming the desired pattern by etching, or other means.

In the conventional X-ray lithography as mentioned above, the masking material support film has a low X-ray transmissivity and thus must be made considerably thin to obtain a sufficient X-ray transmission. It has been a problem to make such a thin film.

SUMMARY OF THE INVENTION

An object of the present invention is to provide a lithographic mask structure and a lithographic process with an effectively improved sensitivity of photosensitive material such as a resist, etc. and a better lithographic applicability, thereby solving the problems encountered in the prior art.

Another object of the present invention is to provide a lithographic mask structure and a lithographic process capable of lithographic application under milder conditions of X-ray transmissivity, thickness, etc. of masking material support film.

Another object of the present invention is to provide a lithographic mask structure which comprises a masking material support film and an annular support substrate for supporting the masking material support film at the periphery, the masking material support film containing a fluorescent substance.

A further object of the present invention is to provide a lithographic mask structure which comprises a masking material support film and an annular support substrate for supporting the masking material support film at the periphery the masking material support film being composed of a fluorescent substance.

Still a further object of the present invention is to provide a lithographic process which comprises exposing a photosensitive material to irradiation with a radiation beam through a masking material support film provided with a masking material patternwise, the masking material support film being composed of a fluorescent substance, a secondary radiation beam being generated from the fluorescent substance exposed to the radiation beam, and the photosensitive material being exposed to the secondary radiation beam and the radiation beam together.

Still a further object of the present invention is to provide a lithographic process which comprises exposing a photosensitive material to irradiation with a radiation beam through a masking material support film provided with a masking material patternwise, the masking materail support film containing a fluorescent substance, a secondary radiation beam being generated from the fluorescent substance exposed to the radiation beam, and the photosensitive material being exposed to the secondary radiation beam and the radiation beam together.

DETAILED DESCRIPTION OF THE PREFERRED EMBODIMENTS

Figure 1:
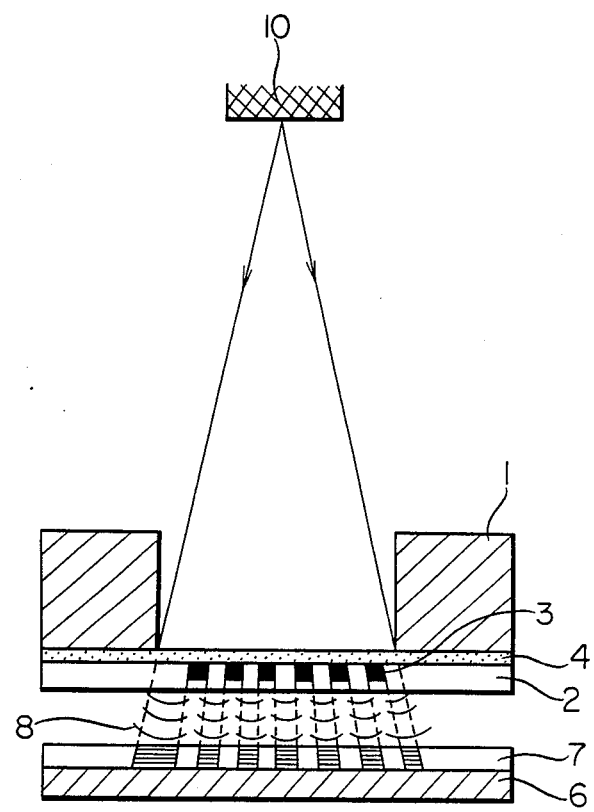
FIG. 1 is a schematic cross-sectional view of the main part of a light exposure apparatus using a lithographic mask structure according to one embodiment of the present invention.

The present invention is particularly directed to the intensification of the effective sensitivity of a resist by the secondary radiation beam (fluorescent beam) generated from the masking material support film exposed to a radiation beam. For example, when an X-ray is used as a radiation beam, what plays a role of projecting a pattern onto the resist is this radiation beam as the principal beam. That is, the secondary radiation beam as an auxiliary beam plays a role of intensifying the sensitivity of a resist and must be below a given threshold value. The threshold value depends upon the baking of a resist, development conditions, etc. and cannot be specified. When, for example, the kind and the thickness of a resist, treating conditions such as baking conditions, etc., development conditions, factors of radiation beam source, such as kind, power, etc. are set, the threshold value can be determined by the emitted light wavelength range, emitted light efficiency, thickness and density of a fluorescent material.

In the present invention, the secondary radiation beam in such a degree as not to exceed the threshold value is used to intensify the sensitivity on the basis of such resist characteristics that the resist is not sensitive to a radiation beam below the threshold value, but made sensitive to a radiation beam when it exceeds the threshold value. Thus, the power of the radiation beam as the principal beam for projecting a pattern is in such a degree as to only exceed the threshold value together with the secondary irradiation beam, and thus no large power is required. In other words, a clear pattern can be formed with a small power.

In the present invention, a particularly effective radiation beam is an X-ray, and ultraviolet beams including a vacuum ultraviolet beam, electron beams, and ion beams have also a resist-sensitizing effect.

The wavelength range of the secondary radiation beam is not particularly limited, but is practically 200 to 550 nm, when a wavelength range corresponding to the photosensitive range of the lithographic resist of the present invention is taken into account. A paticularly effective range is 300 to 450 nm, which is covered by most of the photolithographic resists as the photosensitive range and in which most of fluorescent materials emit the secondary radiation beams.

The kind of the fluorescent materials is not particularly limited, and their typical examples are as follows: ZnS:Ag, ZnS:Cu. Al, $Zn_2SiO_4$:Mn, $CaWO_4$, $Ca_2MgSi_2O_7$:Ce, ZnO:Zn, ZnS:Cu, $Y_2O_2S$:Tb, $YAlO_3$:Ce.Ag, ZnS:Ag. Ga. Cl, ZnS:Zn+$In_2O_3$, $BaSi_2O_5$:Pb, (Sr, Ca)$B_4O_7$:$Eu^{2+}$, $Ca_2B_5O_9Cl$:$Eu^{2+}$, $Sr_4Si_3O_8Cl_4$:$Eu^{2+}$, $BaMgAl_{14}O_{23}$:$Eu^{2+}$, $BaO.6Al_2O_3$:Mn, $BaSO_4$:Pb, BaFCl:$Eu^{2+}$, $La_2O_2S$:Tb, $Gd_2O_2S$:Tb, $MgB_4O_7$:Tb, $Li_2B_4O_7$:Cu, $Ba_2Si_2O_5$:Pb, NaI:Tl, $CaF_2$:Eu, $MgF_2$:Eu, KCl:Tl, CaS:Bi, $\beta CaSiO_3$:Pb, $BaSi_2O_5$:Pb, $Zn_2SiO_4$:Ti, $CaO.MgO.2SiO_2$:Ti, $Ca_3(PO_4)_2$:Ce, $Ca_3(PO_4)_2$:Ce.Mn, $Ca_3(PO_4)_2$:Tl, $MgWO_4$, etc., and their mixtures.

The colon in the chemical formulae of the foregoing fluorescent materials is a symbol showing that the element or ion at the right side of the colon in an additive.

In the lithographic mask structure of the present invention, the masking material support film is composed of a fluorescent material or contains the fluorescent material. In the former case, the thickness of the masking material support film is preferable 2 $\mu$m or more from the viewpoint of its strength and 10 $\mu$m or less from the viewpoint of the radiation beam transmissibility. In the former case, various florescent materials can be used to form a masking material support film, and particularly it is preferable from the viewpoint of strength to use $CaF_2$:Eu and $MgF_2$:Eu. In the latter case, the masking material support film is in the form of a laminate film comprising, for example, a film of fluorescent material and a film of inorganic material such as silicon nitride, etc. or an organic material such as polyimide, etc. Particularly, a Laminate film with a film of organic material is effective from the viewpoint of the strength. laminate film is not limited to two layers, but may be in more than two layers.

The material for a film of inorganic material in the laminate film can include ceramics of AlN, Al$_2$O$_3$, BN, SiO$_2$, SiC, aluminum oxynitride (7Al$_2$O$_3$.3AlN), sialon (Si$_2$Al$_4$O$_4$N$_4$), etc. besides the above-mentioned, and the material for a film of organic material in the laminate film can include polyamide, poly-p-xylylene (trade name: parylene, produced by Union Carbide Co.,) (trademark), polyethylene terephthalate, polyacrylonitrile, polyethylenepentene copolymer, etc.

It is desirable from the viewpoint of radiation beam transmissibility, etc. that the thickness of a film composed of the fluorescent material is 1 to 5 μm, and the entire thickness of a masking material support film is not more than a few tens μm.

Furthermore, in the latter case, the masking material support film may be such that fine particles of a fluorescent material are distributed in the masking material support film, besides the above-mentioned form. It is preferable that the fine particles have a size of not more than 1 μm. Ultra-fine particles, that is, uniformly fine particles having sizes of a few tens to a few thousand Å, are particularly preferable, because they can be uniformly distributed in the masking material support film. The material for a masking material support film in which a fluorescent material is distributed is not particularly limited, but an organic material such as polyimide, etc. is preferable from the viewpoint of easy preparation.

Examples of the present invention will be described below, referring to the accompanying drawings.

EXAMPLE 1

FIG. 1 is a schematic cross-sectional view of the main parts of a light exposure apparatus using a lithographic mask structure according to one embodiment of the present invention, where X-ray is used as a radiation beam. Numeral 1 is an annular support substrate, 2 is a fluorescent material layer formed by vapor deposition of αCaSiO$_3$Pb, etc., and 3 is a pattern-wise masking material formed from gold, etc., for example, 0.7 μm thick. Numeral 4 is a film of polyimide, etc., 6 is a wafer of Si, etc., and 7 is a resist. Numeral 8 is a secondary radiation beam (fluorescent beam) generated from the fluorescent material layer 2.

X-ray such as an RhL$_{60}$ beam, etc. generally from an X-ray beam source (target) 10 is irradiated onto the resist 7 coated on the wafer 6 through an X-ray lithographic mask structure. The resist 7 is made from, for example, polymethylisopropenylketone (PMIPK), etc., onto which the X-ray transmitted through the masking material support film without absorption by the pattern-wise masking material 3 is irradiated to project the pattern of the masking material 3 thereon. In this case, the secondary radiation beam generated from the fluorescent material layer 2 has a peak of, for example, 300 nm and is irradiated onto the resist 7.

EXAMPLE 2

Figure 2:
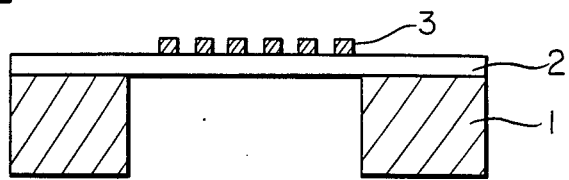
FIG. 2 is a schematic cross-sectional view of a lithographic mask structure according to another embodiment of the present invention.

FIG. 2 is a schematic cross-sectional view of a lithographic mask structure according to another embodiment of the present invention, where a masking material support film is made from a fluorescent material. Numeral 1 is a silicon annular support substrate, 2 is a 6-mm thick, fluorescent material layer composed of CaF$_2$:Eu, and 3 is a 1-μm thick, pattern-wise gold masking material On the other hand, a cyclized rubber-based resist OMR-83 (trademark of a product made by Tokyo Ohka K.K., Japan) is coated to a thickness of 1.5 μm on a silicon wafer (not shown in the drawing) in advance, and subjected to soft contact exposure with an RhLα beam through an X-ray aligner, and then to a specific development treatment. To obtain a specific pattern, it has been found that an irradiation dosage from a beam source of about one-fifth of the conventional power is enough when the present lithographic mask structure is used.

The present lithographic mask structure can be prepared in the following manner. A fluorescent material CaF$_2$:Eu is vapor-deposited on a silicon wafer provided with oxide films (SiO$_2$ layers) on both sides in an EB vapor deposition apparatus to form a fluorescent material layer. Then, a Ni film, 500 Å thick, is formed on the fluorescent material layer, and then a PMMA-based resist OEBR-1000 (trademark of a product made by Tokyo Ohka K.K., Japan) is applied thereto, and prebaked, and a mask pattern is depicted on the resist by an EB depicting apparatus. A resist pattern is formed with a specific developing solution under development conditions. Then, gold plating is conducted with the nickel layer as an electrode to form a gold pattern. Then, a tar-based protective film is applied to the surface and the oxide film (SiO$_2$) in the mask area at the back side is removed by a hydrofluoric acidnitric acid mixture. Then, electrolytic etching is conducted with an electrolytic solution containing about 3% of hydrofluoric acid to remove the Si wafer in the mask area. Then, the SiO$_2$ layer in the mask area is removed with a hydrofluoric acid-nitric acid mixture. Then, the tar-based paint is removed with acetone, and then removal of the resist and the Ni layer by 30% nitric acid are carried out. A lithographic mask structure having a masking material support film of CaF$_2$:Eu monolayer as shown in this Example can be obtained.

EXAMPLE 3

In place of the X-ray, irradiation of far ultraviolet ray is carried out with the same mask structure as used in Example 2. In the lithography using a quartz plate having a pattern-wise chromium masking material on the surface, resist OMR-83 (trademark of a product made by Tokyo Ohka K.K., Japan) is not thoroughly cured, and the resist film peels off in the development, with a failure to form a resist pattern. With the lithographic mask structure of this Example, a satisfactory resist pattern can be formed.

EXAMPLE 4

Figure 3:
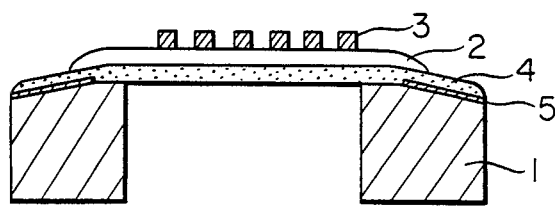
FIG. 3 is a schematic cross-sectional view of a lithographic mask structure according to another embodiment of the present invention.

FIG. 3 is a schematic cross-sectional view of a lithographic mask structure according to other embodiment of the present invention, where numeral 1 is an annular support substrate, 2 is a fluorescent material layer, 3 is a pattern-wise masking material, 4 is a film, and 5 is an adhesive.

The mask of FIG. 3 is prepared in the following manner. At first, an equilaterally stretched polyimide film is pasted as a film 4 onto, for example, an annular support disk substrate 1 by an adhesive 5, and then BaFCl:Eu is vapor-deposited to a thickness of about 2 μm as a fluorescent material layer 2 thereon in an electron beam vapor deposition apparatus. Then, a mask pattern is formed in the same steps as in Example 2.

In the light exposure, a cinnamate-based resist KPR (trademark of Kodak, USA) is coated as a resist to a thickness of about 2 μm onto a silicon wafer provided with an oxide film, and then exposed to irradiation of X-ray (PdLα beam). It has been found that a good resist pattern can be formed with an irradiation dosage from a beam source of about one-fourth of the conventional power by using the present lithographic mask structure.

EXAMPLE 5

Figure 4:
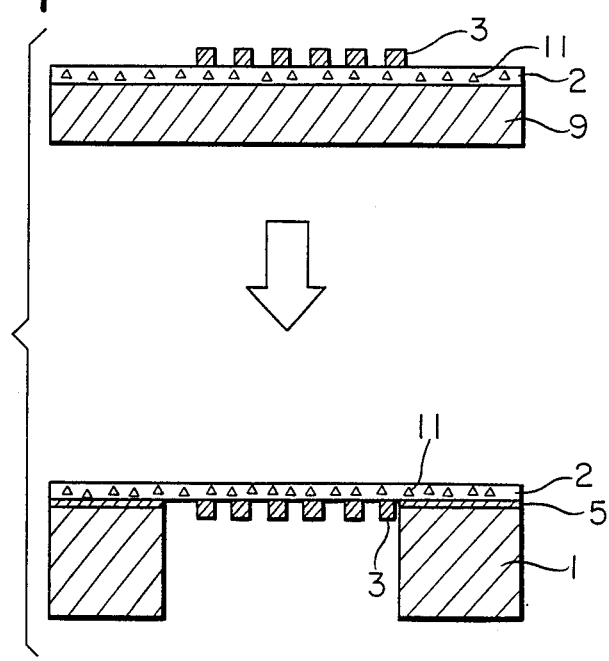
FIG. 4 is a schematic cross-sectional process view showing a process for preparing a lithographic mask structure according to a further embodiment of the present invention.

FIG. 4 is a schematic cross-sectional process view showing a process for preparing a lithographic mask structure according to further embodiment of the present invention, where the common or corresponding members to those of the preceding Examples are represented by identical reference numerals, and numeral 11 is a fluorescent material and 9 is a silicon plate.

The lithographic mask structure of FIG. 4 can be prepared in the following manner. At first, ultrafine particles of fluorescent material 11 ($CaWO_4$) are distributed in a polyimide precursor P1Q (trademark of a product made by Hitachi Kasei Kogyo K.K., Japan), and the resulting dispersion is coated to a thickness of about 6 μm onto a silicon plate 9. Then, the coating is subjected to a specific curing (cross-linking) treatment to form a masking material support film as fluorescent material layer 2 containing the distributed fluorescent material 11. Then, a pattern-wise masking material of gold (Au) is formed on the mask material support film according to the same photolithographic process as in the preceding Examples. Then, the silicon plate 9 pasted on the annular support substrate 1 by the adhesive 5 is removed therefrom to prepare a lithographic mask structure.

Then, a gelatin bichromate is applied to a thickness of about 2 μm as a resist onto the silicon wafer and baked by soft contact with X-ray (RhLa beam). It has been found that a good pattern can be obtained with an irradiation dosage from a beam source of about one-fourth of the conventional power by using the present lithographic mask structure.

EXAMPLE 6

Figure 5:
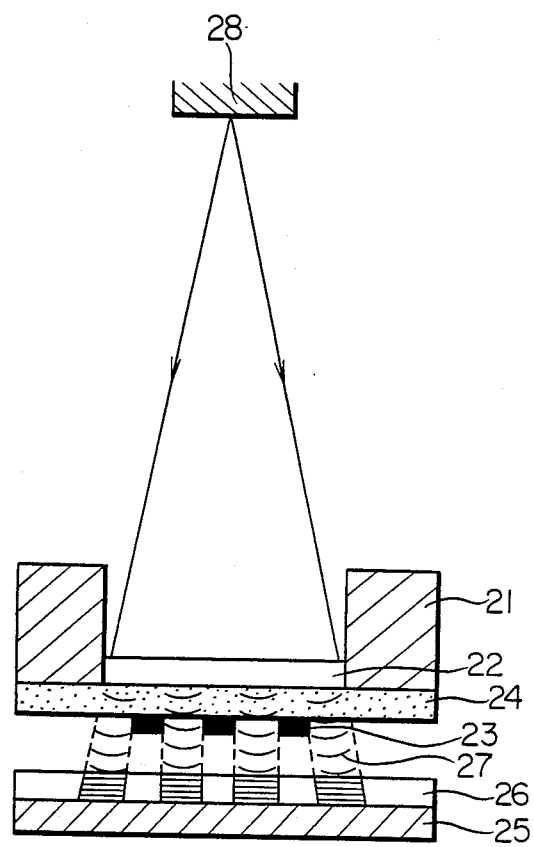
FIG. 5 is a schematic cross-sectional view of the main part of a light exposure apparatus using a lithographic mask structure according to still a further embodiment of the present invention.

FIG. 5 shows a schematic cross-sectional view of the essential parts of a light exposure apparatus using a lithographic mask structure according to still further embodiment of the present invention, wherein numeral 2 is an annular support substrate, 22 is a fluorescent material layer formed by vapor deposition of, for example, $BaSi_2O_5:Pb$, etc., and 23 is a pattern-wise masking material of gold, etc., 0.7 μm thick. Numeral 24 is a film of polystyrene terephthalate, etc., 25 is a wafer of Si, etc., 26 is a resist, and 27 is a secondary irradiation beam (fluorescent beam) generated from the fluorescent material layer 22.

X-ray such as a RhLa beam, etc. generated from an X-ray source (target) 28 is irradiated onto the resist 26 coated on the silicon wafer 25 through the lithographic mask structure. The resist 26 is, for example, OMR-83 (trademark of a produce made by Tokyo Ohka K.K., Japan), etc., onto which the X-ray transmitted through the mask material support film without absorption in the pattern-wise masking material 23 is irradiated to project the pattern of the masking material 23 onto the resist 26. In this case, the secondary irradiation beam 27 generated from the fluorescent material layer 22 has a peak of 350 nm and irradiated onto the resist 26.

In that apparatus, a 6- μm thick polyethylene terephthalate film is used as a film 24, a 5- μm thick $BaSi_2O_5:Pb$ film is used as a fluorescent material layer 22, and 0.7-μm thick gold film is used as a masking material 23, where the fluorescent material layer 22 is provided by dispersing $BaSi_2O_5$ in polyvinyl alcohol (PVA) and removing the water therefrom in a drying over at about 95° C. The resist 26 is provided by applying a cyclized rubber-based resist OMR-83 (trademark of a product made by Tokyo Ohka K.K., Japan) to a thickness of 1.5 μm to the wafer 25, in advance, subjecting the resist to soft contact light exposure with a RhLα beam through an X-ray aligner under reduced pressure of $5 \times 10^{-3}$ Torr, followed by a specific development treatment. It has been found that an irradiation dosage from a beam source of about one-third of the conventional power is enough with the present lithographic mask structure.

EXAMPLE 7

A 6 μm-thick polyethylene terephthalate film is used as a film 24 and a 3 μm-thick ZnS:Ag film is used as a fluorescent material layer 22, where ZnS:Ag is vapor-deposited onto the polyethylene terephthalate film 24 in an EB vapor deposition apparatus to form the ZnS:Ag film. The resist 26 is a 1- μm thick film of polymethylisopropenylketone (PMIPK). It has been found by the same light exposure as in Example 6 that the resist 26 has an effective sensitivity 3 times as high as the conventional one.

EXAMPLE 8

The film 24 is a 6- μm thick poly-p-xylylene (trade name: PARYLENE, produced by Union Carbide Co.,) film, and the fluorescent material layer 22 is a 5- μm thick $YAlO_3:Ce$ film, where $YAlO_3:Ce$ is vapor-deposited onto the film 24 in an EB vapor deposition apparatus to form the $YAlO_3:Ce$ film. The resist 26 is a 1.2- μm thick film of OMR-83 (trademark of a product made by Tokyo Ohka K.K., Japan). It has been found by the same light exposure as in Example 7 of that the resist 26 has an effective sensitivity 4 times as high as the conventional one.

EXAMPLE 9

The film 24 is a 6- μm thick LUMIRRORR (trademark of a product made by Toray, Japan) film, the fluorescent material layer 22 is a 2-μm thick ZnS:Ag film, the masking material 23 is a 0.8-mm thick gold film, and the resist 26 is a 1- μm thick film of OMR-83 (trademark of a product made by Tokyo Ohka K.K., JAPAN). It has been found by the same light exposure as in Example 7 that the resist 26 has an effective sensitivity 5 times as high as the conventional one.

EXAMPLE 10

Figure 6:
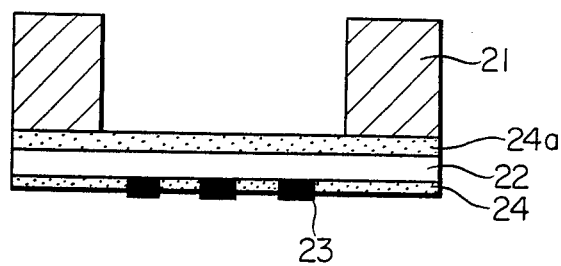
FIG. 6 is a schematic cross-sectional view of a lithographic mask structure according to still a further embodiment of the present invention.

FIG. 6 is a schematic cross-sectional view of a lithographic mask structure according to still further embodiment of the present invention, where the same patternwise irradiation as in Example 9 is carried out with the lithographic mask structure as shown in FIG. 6. Numeral 24a is a 6-μm thick polyimide film, 22 is a fluorescent material layer of CaF; Eu vapor-deposited to a thickness of 1 μm, thereon by sputtering vapor deposition, and 24 is a 0.2- μm thick polyimide film. It has been found that the resist 26 has an effective sensitivity 4 times as high as the conventional one.

The present lithographic mask structure covers the following three types.

(1) A masking material only whose peripheral part is supported by an annular support substrate,
(2) A masking material provided in a film state on the entire surface of the masking material support film, and
(3) A masking material provided pattern-wise.

As described in detail above, the present invention can improve the effective sensitivity of a photosensitive material by irradiation of a secondary irradiation beam generated from a fluorescent material to the photosensitive material since the masking material support film for a lithographic mask structure to be exposed to a radiation beam is composed from the fluorescent material or contains the fluorescent material, and thus can attain a good lithography. Furthermore, strict conditions such as X-ray transmissivity, thickness, etc., of the masking material support film can be lessened in the present lithographic mask structure.

Furthermore, the present lithographic mask structure can attain a good lithography without providing any additional light source, that is, by using the conventional lithographic apparatus as such.

We claim:

1. A lithographic mask structure which comprises a masking material support film and an annular support substrate for supporting the masking material support film at the periphery, the masking material support film containing a fluorescent substance.

2. A lithographic mask structure according to claim 1, wherein the fluorescent substance is $CaF_2:Eu$.

3. A lithographic mask structure according to claim 1, wherein the fluorescent substance is $MgF_2:Eu$.

4. A lithographic mask structure according to claim 1, wherein the masking material support film is a laminate film of a layer of the fluorescent substance and a layer of an inorganic material.

5. A lithographic mask structure according to claim 4, wherein the inorganic material is AlN.

6. A lithographic mask structure according to claim 4, wherein the inorganic material is SiN.

7. A lithographic mask structure according to claim 4, wherein the inorganic material is BN.

8. A lithographic mask structure according to claim 4, wherein the inorganic material is $Al_2O_3$.

9. A lithographic mask structure according to claim 4, wherein the inorganic material is $SiO_2$.

10. A lithographic mask structure according to claim 4, wherein the inorganic material is SiC.

11. A lithographic mask structure according to claim 4, wherein the inorganic material is aluminum oxynitride.

12. A lithography mask structure according to claim 1, wherein the masking material support film is a laminate film of a layer of the fluorescent substance and a layer of an organic material.

13. A lithographic mask structure according to claim 12, wherein the organic material is polyimide.

14. A lithographic mast structure according to claim 12, wherein the organic material is polyamide.

15. A lithographic mask structure according to claim 4, wherein the layer of the fluorescent substance has a thickness of 1 to 5 $\mu m$.

16. A lithographic mask structure according to claim 4, wherein the masking material support film has a thickness of not more than a few tens $\mu m$.

17. A lithographic mask structure according to claim 12, wherein the layer of the fluorescent substance has a thickness of 1 to 5 $\mu m$.

18. A lithographic mask structure according to claim 12, wherein the masking material support film has a thickness of not more than a few tens $\mu m$.

19. A lithographic mask structure according to claim 1, wherein fine particles of the fluorescent substance are distributed in the masking material support film.

20. A lithographic mask structure according to claim 19, wherein the fine particles have sizes of not more than 1 $\mu m$.

21. A lithographic mask structure according to claim 19, wherein the masking material support film is composed of an organic material.

22. A lithographic mask structure according to claim 19, wherein the masking material support film is composed of an inorganic material.

23. A lithographic mask structure according to claim 1, wherein the annular support substrate is in a circular form.

24. A lithographic mask structure according to claim 1, wherein the annular support substrate is composed of Si.

25. A lithographic mask structure according to claim 1, wherein the masking material support film has a masking material provided in a thin film form on the support film.

26. A lithographic mask structure according to claim 25, wherein the masking material is provided patternwise.

27. A lithographic mask structure according to claim 25, wherein the masking material is gold.

28. A lithographic mask structure according to claim 25, wherein the masking material is platinum.

29. A lithographic mask structure according to claim 25, wherein the masking material is tungsten.

30. A lithographic mask structure according to claim 25, wherein the masking material is tantalum.

31. A lithographic mask structure according to claim 25, wherein the masking material is copper.

32. A lithographic mask structure according to claim 25, wherein the masking material is nickel.

33. A lithographic mask structure according to claim 25, wherein the masking material has a thickness of 0.5 to 1 $\mu m$.

34. A lithographic mask structure which comprises a masking material support film and an annular support substrate for supporting the masking material support film at the periphery, the masking material support film being composed of a fluorescent substance.

35. A lithographic mask structure according to claim 34, wherein the fluorescent substance is $CaF_2:Eu$.

36. A lithographic mask structure according to claim 34, wherein the fluorescent substance is $MgF_2:Eu$.

37. A lithographic mask structure according to claim 34, wherein the masking material support film has a thickness of 2 to 10 $\mu m$.

38. A lithographic mask structure according to claim 34, wherein the annular support substrate is in a circular form.

39. A lithographic mask structure according to claim 34, wherein the annular support substrate is composed of Si.

40. A lithographic mask structure according to claim 34, wherein the masking material support film has a masking material provided in a thin film form on the support film.

41. A lithographic mask structure according to claim 40, wherein the masking material is provided patternwise.

42. A lithographic mask structure according to claim 40, wherein the masking material is gold.

43. A lithographic mask structure according to claim 40, wherein the masking material is platinum.

44. A lithographic mask structure according to claim 40, wherein the masking material is tungsten.

45. A lithographic mask structure according to claim 40, wherein the masking material is tantalum.

46. A lithographic mask structure according to claim 40, wherein the masking material is copper.

47. A lithographic mask structure according to claim 40, wherein the masking material is nickel.

48. A lithographic mask structure according to claim 40, wherein the masking material has a thickness of 0.5 to 1 $\mu$m.

49. A lithographic process which comprises exposing a photosensitive material to irradiation with a radiation beam through a masking material support film provided with a masking material pattern-wise, the masking material support film being composed of a fluorescent substance, a secondary radiation beam being generated from the fluorescent substance exposed to the radiation beam, and the photosensitive material being exposed to the secondary radiation beam and the radiation beam together.

50. A lithographic process according to claim 49, wherein the radiation beam is an X-ray beam.

51. A lithographic process according to claim 49, wherein the secondary radiation beam is an ultraviolet beam.

52. A lithographic process according to claim 49, wherein the secondary radiation beam is visible light.

53. A lithographic process which comprises exposing a photosensitive material to irradiation with a radiation beam through a masking material support film provided with a masking material pattern-wise, the masking material support film containing a fluorescent substance, a secondary radiation beam being generated from the fluorescent substance exposed to the radiation beam, and the photosensitive material being exposed to the secondary radiation beam and the radiation beam together.

54. A lithographic process according to claim 53, wherein the radiation beam is an X-ray beam.

55. A lithographic process according to claim 53, wherein the secondary radiation beam is an ultraviolet beam.

56. A lithographic process according to claim 53, wherein the secondary radiation beam is visible light.

* * * * *

UNITED STATES PATENT AND TRADEMARK OFFICE
CERTIFICATE OF CORRECTION

PATENT NO. : 4,735,877            Page 1 of 2
DATED : April 5, 1988
INVENTOR(S): HIDEO KATO, ET AL.

It is certified that error appears in the above-identified patent and that said Letters Patent is hereby corrected as shown below:

COLUMN 2

Line 14, "parylene)" should read --PARYLENE--.

COLUMN 3

Line 7, "periphery the" should read --periphery, the--.
Line 25, "materail" should read --material--.

COLUMN 4

Line 17, "irradiation" should read --radiation--.
Line 43, "$BaSi_2O_5:Pb$," should be deleted.
Line 48, "colon in" should read --colon is--.
Line 53, "preferable" should read --preferably--.
Line 65, "Laminate" should read --laminate--.
Line 66, "the" (second occurrence) should be deleted.
Line 67, "laminate" should read --The laminate--.

COLUMN 5

Line 7, "parylene," should read --PARYLENE,--.
Line 45, "$RhL_{60}$" should read --$RhL_\alpha$--.

COLUMN 6

Line 26, "acidnitric" should read --acid-nitric--.

UNITED STATES PATENT AND TRADEMARK OFFICE
CERTIFICATE OF CORRECTION

PATENT NO. : 4,735,877          Page 2 of 2
DATED : April 5, 1988
INVENTOR(S) : HIDEO KATO, ET AL.

It is certified that error appears in the above-identified patent and that said Letters Patent is hereby corrected as shown below:

COLUMN 7

Line 42, "to still" should read --to a still--.
  Line 48, "polystylene" should read --polystyrene--.
  Line 56, "produce" should read --product--.

COLUMN 8

Line 32, "YAlO$_3$:Ce" should read --YAlO$_3$:Ce--.
  Line 35, "of" should be deleted.
  Line 40, "LUMIRRORR" should read --LUMIRROR--.
  Line 57, "CaF; Eu" should read --CaF:Eu--.
  Line 63, "types." should read --types:--.

COLUMN 9

Line 46, "lithography" should read --lithographic--.
  Line 52, "mast" should read --mask--.

Signed and Sealed this

Third Day of January, 1989

Attest:

DONALD J. QUIGG

Attesting Officer

Commissioner of Patents and Trademarks